United States Patent
Oka et al.

(10) Patent No.: US 11,926,924 B2
(45) Date of Patent: Mar. 12, 2024

(54) INDIUM PHOSPHIDE SUBSTRATE, SEMICONDUCTOR EPITAXIAL WAFER, METHOD FOR PRODUCING INDIUM PHOSPHIDE SINGLE-CRYSTAL INGOT AND METHOD FOR PRODUCING INDIUM PHOSPHIDE SUBSTRATE

(71) Applicant: JX METALS CORPORATION, Tokyo (JP)

(72) Inventors: Shunsuke Oka, Kitaibaraki (JP); Keita Kawahira, Kitaibaraki (JP); Akira Noda, Kitaibaraki (JP)

(73) Assignee: JX METALS CORPORATION, Tokyo (JP)

( * ) Notice: Subject to any disclaimer, the term of this patent is extended or adjusted under 35 U.S.C. 154(b) by 0 days.

(21) Appl. No.: 18/031,088

(22) PCT Filed: Oct. 7, 2021

(86) PCT No.: PCT/JP2021/037240
§ 371 (c)(1),
(2) Date: Apr. 10, 2023

(87) PCT Pub. No.: WO2022/168369
PCT Pub. Date: Aug. 11, 2022

(65) Prior Publication Data
US 2023/0374700 A1    Nov. 23, 2023

(30) Foreign Application Priority Data

Feb. 2, 2021  (JP) ................................. 2021-015354

(51) Int. Cl.
*C30B 29/40* (2006.01)
*C30B 15/20* (2006.01)

(52) U.S. Cl.
CPC ............ *C30B 29/40* (2013.01); *C30B 15/206* (2013.01)

(58) Field of Classification Search
CPC ..... C30B 15/203; C30B 15/206; C30B 27/02; C30B 29/40
See application file for complete search history.

(56) References Cited

U.S. PATENT DOCUMENTS

| 2007/0087539 A1 | 4/2007 | Kohiro et al. |
| 2007/0101924 A1 | 5/2007 | Kawase |

(Continued)

FOREIGN PATENT DOCUMENTS

| JP | 63-107886 A | 5/1988 |
| JP | 2-40640 B2  | 9/1990 |

(Continued)

OTHER PUBLICATIONS

International Search Report for PCT/JP2021/037240 (PCT/ISA/210) dated Nov. 30, 2021.

(Continued)

*Primary Examiner* — Elizabeth E Mulvaney
(74) *Attorney, Agent, or Firm* — Birch, Stewart, Kolasch & Birch, LLP

(57) ABSTRACT

Provided is an indium phosphide substrate, a semiconductor epitaxial wafer, a method for producing an indium phosphide single-crystal ingot and a method for producing indium phosphide substrate capable of suppressing concave defects. An indium phosphide substrate has a diameter of 100 mm or less, and at least one of surfaces has zero concave defects detected in the topography channel, by irradiating a laser beam of 405 nm wavelength with S-polarized light on the surface.

7 Claims, 3 Drawing Sheets

(56) References Cited

U.S. PATENT DOCUMENTS

| | | |
|---|---|---|
| 2008/0019896 A1 | 1/2008 | Noda et al. |
| 2008/0214013 A1 | 9/2008 | Sioncke et al. |
| 2008/0311417 A1 | 12/2008 | Eichler et al. |
| 2016/0043248 A1* | 2/2016 | Noda .................... C30B 15/203 136/252 |
| 2018/0102446 A1* | 4/2018 | Noda ...................... C30B 15/30 |
| 2020/0227268 A1 | 7/2020 | Wang et al. |
| 2021/0149172 A1 | 5/2021 | Fujimura |

FOREIGN PATENT DOCUMENTS

| | | |
|---|---|---|
| JP | 11-54579 A | 2/1999 |
| JP | 2000-327496 A | 11/2000 |
| JP | 2002-234792 A | 8/2002 |
| JP | 2003-137699 A | 5/2003 |
| JP | 2005-150187 A | 6/2005 |
| JP | 2008-120614 A | 5/2008 |
| JP | 2008-244434 A | 10/2008 |
| JP | 2011-220757 A | 11/2011 |
| JP | 2012-236770 A | 12/2012 |
| JP | 2013-256444 A | 12/2013 |
| JP | 2020-528392 A | 9/2020 |
| WO | WO 2004/106597 A1 | 12/2004 |
| WO | WO 2005/106083 A1 | 11/2005 |
| WO | WO 2019/202650 A1 | 10/2019 |
| WO | WO 2020/158316 A1 | 8/2020 |

OTHER PUBLICATIONS

International Preliminary Report on Patentability, dated Aug. 3, 2023, and English translation of the Written Opinion of the International Searching Authority, dated Nov. 30, 2021 (Forms PCT/IB/373 and PCT/ISA/237) for International Application No. PCT/JP2021/037240.

* cited by examiner

INDIUM PHOSPHIDE SUBSTRATE, SEMICONDUCTOR EPITAXIAL WAFER, METHOD FOR PRODUCING INDIUM PHOSPHIDE SINGLE-CRYSTAL INGOT AND METHOD FOR PRODUCING INDIUM PHOSPHIDE SUBSTRATE

FIELD OF THE INVENTION

The present invention relates to an indium phosphide substrate, a semiconductor epitaxial wafer, a method for producing an indium phosphide single-crystal ingot and a method for producing indium phosphide substrate.

BACKGROUND OF THE INVENTION

Indium phosphide (InP) is a Group III-V compound semiconductor material composed of indium (In) of Group III and phosphorus (P) of Group V. The semiconductor material has characteristics in which a band gap is 1.35 eV, and an electron mobility is ~5400 $cm^2/V \cdot s$, and the electron mobility under a high electric field is higher than that of other general semiconductor materials such as silicon and gallium arsenide. Further, the semiconductor material has characteristics in which its stable crystal structure under ordinary temperature and ordinary pressure is a cubic sphalerite type structure, and its lattice constant is larger than that of a compound semiconductor such as gallium arsenide (GaAs) and gallium phosphide (GaP).

Single-crystalline InP is used as high-speed electronic devices, taking advantage of its large electron mobility compared to silicon and other materials. The large lattice constant compared to gallium arsenide (GaAs), gallium phosphide (GaP), etc. can also reduce the lattice mismatch ratio when growing heteroepitaxial ternary mixtures such as InGaAs and ternary mixtures such as InGaAsP. Therefore, InP single crystals are used as substrates for various optical communication devices such as semiconductor lasers, optical modulators, optical amplifiers, optical waveguides, light-emitting diodes, and light-receiving devices formed by stacking these mixed-crystal compounds, and for optical integrated circuits that combine them.

To form the various devices described above, InP substrates are made from InP ingots that have been single-crystallized and cut into thin sheets (wafers) in a predetermined crystal orientation. For the production of InP single-crystal ingots, which are the basis of the substrate, such methods as the vertical Bridgman method (VB method) as disclosed in Patent Literature 1 or 2, the vertical temperature gradient Freeze method (VGF method) as disclosed in Patent Literature 3, and the liquid encapsulation Choklarsky method (LEC method) as disclosed in Patent Literatures 4 and 5 have been used in the past.

The VB or VGF method is a method to grow single crystals continuously in the vertical direction in a vessel by forming a temperature gradient vertically to the raw material melt held in the vessel and continuously moving the freezing point (melting point) of the crystals vertically by moving temperature distribution in either the vessel or the furnace in the vertical direction. The VB and VGF methods can reduce the temperature gradient set at the vertical solid-liquid interface, and the average crystal dislocation density can be kept low. However, the VB and VGF methods have the disadvantages of relatively slow crystal growth speed and low productivity, as well as localized areas of high dislocation density caused by stress from the container as the crystals grow.

In contrast, the LEC method is a modification of the Choklarsky method (CZ method), which is also widely used as a general production method for large silicon single-crystals. In this method, the gas-liquid interface on the surface of the material melt for pulling up single crystals is covered with a liquid encapsulant such as boron oxide ($B_2O_3$) or other oxides with low softening point temperature to prevent dissipation of volatile components in the material melt by evaporation while pulling up and growing single crystal ingots by bringing the seed crystal into contact with the material melt. In the LEC method, the temperature gradient formed at the solid-liquid interface between the melt and the crystals being pulled up is generally larger than in the VB and VGF methods described above, and the dislocation density tends to be higher. However, it has a characteristic of fast crystal growth rate and suitability for mass production. As an improvement of the above-mentioned disadvantages, in order to improve the controllability of the temperature gradient at the solid-liquid interface during crystal growth in the LEC method, an improved LEC method called the thermal baffle LEC (TB-LEC) method, in which a bulkhead with a thermal shielding effect is provided above the melt holding vessel, is also used as necessary, as disclosed in Patent Literatures 4 and 5.

In the conventional method of producing single crystals by the LEC method, one of the known issues is to suppress the generation of small pores, called pits, in the single crystal. For example, Patent Literature 6 describes a method for pulling up GaP single crystals by forming a GaP melt covered with a liquid capsule material in a crucible, wherein the GaP single crystal used as a raw material is dehydrated and dried under reduced pressure in advance and the temperature gradient in the crystal pulling axis near the surface in the GaP melt formed in the crucible is set at 30° C./cm to 100° C./cm. In the method, homogeneous and low defect GaP single crystals can be obtained, in which B pits do not appear by etching.

CITATION LIST

Patent Literature

[Patent Literature 1] WO 2004/106597
[Patent Literature 2] Japanese Unexamined Patent Application Publication No. 2008-120614
[Patent Literature 3] Japanese Unexamined Patent Application Publication No. 2000-327496
[Patent Literature 4] WO 2005/106083
[Patent Literature 5] Japanese Unexamined Patent Application Publication No. 2002-234792
[Patent Literature 6] Japanese Examined Patent Application Publication No. 02-040640

SUMMARY OF THE INVENTION

Various technologies have been studied to suppress the occurrence of pits by focusing on the types of pits that occur in single-crystal substrates, but there is still room for further development. In addition, if the generation of specific pits in a single-crystal substrate is completely suppressed, there are significant benefits such as improved surface quality when epitaxial growth is performed on the substrate.

The present invention has been made to solve the above problems. An object of the present invention is to provide an indium phosphide substrate, a semiconductor epitaxial wafer, a method for producing an indium phosphide single-crystal ingot and a method for producing indium phosphide substrate wherein concave defects are suppressed.

In one aspect, the present invention is an indium phosphide substrate,
  wherein the indium phosphide substrate has a diameter of 100 mm or less, and
  at least one of surfaces has zero concave defects detected in the topography channel, by irradiating a laser beam of 405 nm wavelength with S-polarized light on the surface.

In one embodiment, the indium phosphide substrate of the present invention has a diameter of 50 to 100 mm.

In another aspect, the present invention is a semiconductor epitaxial wafer, comprising the indium phosphide substrate for the embodiment of the present invention, and an epitaxial crystal layer on a main surface of the indium phosphide substrate.

In yet another aspect, the present invention is a method for producing an indium phosphide single-crystal ingot,
  wherein a crucible is installed in an LEC furnace, raw materials and an encapsulant are installed in the crucible, the raw materials and the encapsulant are heated and melted by a heater, and a seed crystal is brought into contact with a surface of a generated raw material melt and gradually pulled up to grow an indium phosphide single crystal, and
  wherein the indium phosphide single crystal is grown by pulling up the seed crystal after increasing a temperature in the LEC furnace from room temperature to between 500° C. and 600° C. while maintaining a vacuum of 15 Pa or less, followed by increasing a pressure in the LEC furnace to any pressure in the range between $2.0 \cdot 10^6$ Pa and $4.0 \times 10^6$ Pa.

In yet another aspect, the present invention is a method for producing an indium phosphide substrate, comprising
  a process of cutting an indium phosphide substrate from the indium phosphide single-crystal ingot produced by the method for producing an indium phosphide single-crystal ingot for the embodiment of the present invention.

In one embodiment of the method for producing an indium phosphide substrate of the present invention, the indium phosphide substrate has a diameter of 100 mm or less.

According to the embodiments of the present invention, it is possible to provide an indium phosphide substrate, a semiconductor epitaxial wafer, a method for producing an indium phosphide single-crystal ingot and a method for producing indium phosphide substrate wherein concave defects are suppressed.

DETAILED DESCRIPTION OF THE INVENTION

The embodiments of the present invention are described below with reference to the drawings, but the invention is not to be construed as limited thereto, and various changes, modifications, and improvements may be made based on the knowledge of those skilled in the art to the extent that they do not depart from the scope of the invention.

[Indium Phosphide Substrate]

The indium phosphide substrate of the embodiment of the present invention has zero concave defects detected in the topography channel, by irradiating a laser beam of 405 nm wavelength with S-polarized light on at least one of surfaces. Here, the term "S-polarized light" means a polarized light in which the electric field oscillates perpendicular to the plane of incidence. The term "detected in the topography channel" means scanning the entire surface of the indium phosphide substrate with the laser beam described above to detect concave defects on the surface of the substrate based on the scattered light from the surface. Specifically, by irradiating the entire surface of the indium phosphide substrate (main surface), except for an area 3 mm wide from the outermost edge inward, with a laser beam of 405 nm wavelength in S-polarized light using KLA Tencor's Candela 8720, concave defects with a specified diameter can be detected in the topography channel.

The term "concave defects" means defects on the surface of the substrate that are not through holes but have a depressed shape relative to the surface. The size of the concave defect is not limited, but typically the diameter of the circumscribed circle of the defect when viewed from directly above the surface is 20 to 100 μm. The depth of the concave defects is not limited, but is typically 1 to 5 μm from the surface.

Since the indium phosphide substrate of the embodiment of the present invention has zero surface concave defects as described above, the quality of the surface after epitaxial growth, obtained by performing epitaxial growth on the indium phosphide substrate, is improved, and the characteristics of semiconductor devices, such as dark current of such as photodiodes using said substrate, are improved.

The surface with zero concave defects described above may be only the main surface for forming the epitaxial crystal layer of the indium phosphide substrate, or it may be both the said main surface and the back surface.

The indium phosphide substrate of the embodiment of the present invention has a diameter of 100 mm or less. The diameter of the indium phosphide substrate may be 50 to 100 mm or 50 to 76.2 mm.

The indium phosphide substrate of the embodiment of the present invention may contain a dopant. The dopant may be one or more selected from S, Zn, Fe, and Sn. The dopant concentration of the indium phosphide substrate is also not limited and may be $1 \times 10^{16}$ to $1 \times 10^{19}$ cm$^{-3}$.

[Method for Producing Indium Phosphide Single-Crystal Ingot]

Figure 1:
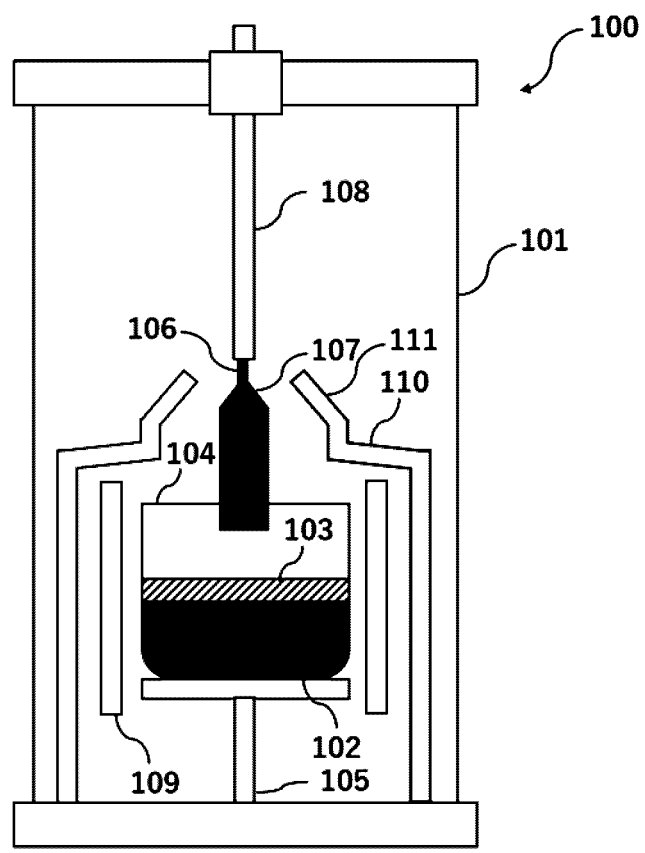
FIG. 1 is a cross-sectional schematic diagram of an LEC furnace used in the LEC method according to an embodiment of the present invention.

Next, a method for producing an indium phosphide single-crystal ingot according to an embodiment of the present invention will be described based on figures. FIG. 1 shows a cross-sectional schematic diagram of a furnace (LEC furnace 100) used in the liquid encapsulation Choklarsky (LEC) method. Inside the LEC furnace 100 is a high-pressure vessel 101 pressurized by inert gas such as nitrogen gas or argon gas, and a crucible 104 rotatably supported by a crucible support shaft 105. Inside the crucible 104 is indium phosphide melt (indium phosphide polycrystalline material), which serves as the raw material 102, and a liquid encapsulant 103 such as $B_2O_3$. From the top of the high-pressure vessel 101, a pull-up axis 108 hangs rotatably and vertically movable toward the inside of the crucible 104.

The LEC furnace 100 has thermal baffles 111 above the crucible 104 that cover the sides of the lower end of the pull-up axis 108 to the seed crystal 106 described below, as well as thermal insulation 110 that covers the heater 109 on the side of the crucible 104. The thermal baffle 111 stands on this thermal insulation 110. The thermal baffles 111 and thermal insulation 110 can be made of quartz, graphite, pBN (pyrolytic boron nitride), etc.

Next, a specific example of growing indium phosphide single crystals using the LEC furnace 100 with the above configuration will be described. First, indium phosphide polycrystalline material and $B_2O_3$ as a liquid encapsulant 103 are placed in a crucible 104 and installed in the high-pressure vessel 101. Next, the crucible 104 is placed at the bottom of the furnace. Next, the LEC furnace 100 is heated to a constant temperature between 500° C. and 600° C. by heater 109 while maintaining a vacuum of 15 Pa or less inside the LEC furnace 100. Then, while maintaining said temperature, the pressure inside the LEC furnace 100 is pressurized until it reaches any pressure in the range of $2.0 \times 10^6$ Pa to $4.0 \times 10^6$ Pa. Next, after the furnace temperature is raised to the temperature at which indium phosphide melts, the seed crystal 106 is brought into contact with the surface of the raw material melt, and the pull-up axis 108 is gradually pulled up to pull up the seed crystal 106 to grow indium phosphide single crystals.

Figure 3:
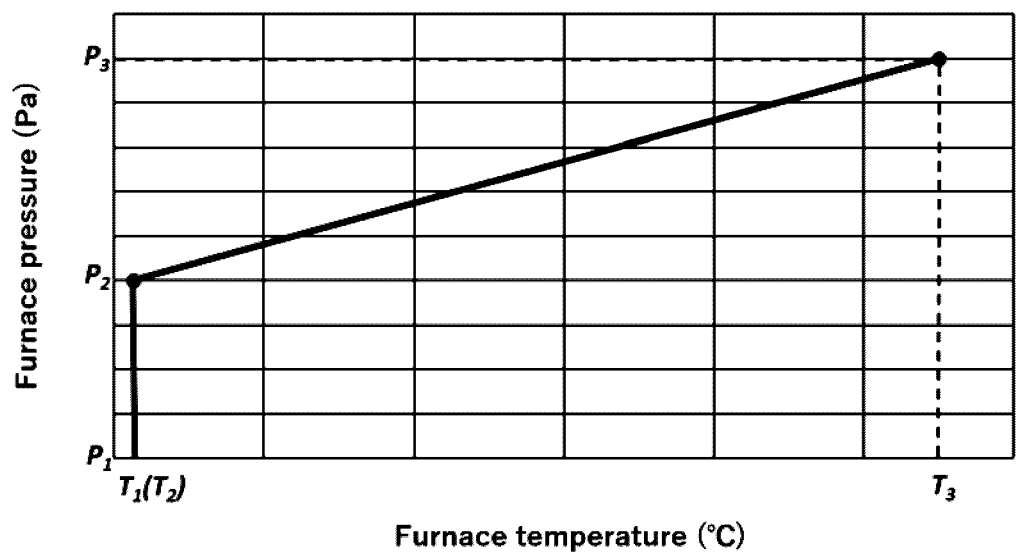
FIG. 3 is a graph showing the relationship between furnace temperature and furnace pressure during a temperature rising process in a conventional LEC furnace.

The above-mentioned process of raising the temperature of raw material 102 to the melting temperature is described in more detail below, along with the differences from and effects of the conventional technology. In the LEC method, the pressure inside the furnace is generally increased to a high pressure during melting of the 102 raw material to prevent volatilization of phosphorus (P). Conventionally, when the temperature in the furnace is heated from $T_1$ to $T_3$ by heater 109 for melting the raw material, the pressure in the furnace increases monotonically according to Boyle-Charles' law, as shown in FIG. 3. According to this type of temperature increase, impurities such as water remain in the indium phosphide polycrystals and $B_2O_3$ in the furnace, and crystal growth with said impurities such as water causes concave-shaped defects in the substrate product.

In contrast, in the process of raising the temperature of the raw material 102 to the melting temperature in the embodiment of the present invention described above, the temperature in the furnace is first raised from room temperature $T_1$ to a constant temperature ($T_2$: 500° C. to 600° C.) while maintaining a vacuum state (P1) of 15 Pa or less. $T_2$: 500° C. to 600° C. is the temperature at which impurities such as moisture are volatilized. This allows sufficient volatilization of impurities such as moisture contained in the hot zone in the furnace (components such as graphite heat insulation tubes that make up the furnace and heaters for heating and quartz components), indium phosphide polycrystals in the raw material 102 and $B_2O_3$ as the encapsulant 103, in the environment immediately before crystal growth. $B_2O_3$ softens at this $T_2$ temperature. A temperature increase rate of 15 to 20° C./min from $T_1$ to $T_2$ is desirable because it favors moisture volatilization and improves production efficiency.

Then, while maintaining said temperature, the pressure in the LEC furnace 100 is pressurized until the pressure becomes any pressure in the range of $2.0 \times 10^6$ Pa to $4.0 \times 10^6$ Pa ($P_2$). Next, the furnace temperature is raised to the temperature at which indium phosphide melts ($T_3$), the polycrystalline material is melted, the seed crystal 106 is brought into contact with the surface of the raw material melt, and the pull-up axis 108 is gradually pulled up to pull up the seed crystal 106 to grow indium phosphide single crystal 107. As the temperature rises from $T_2$ to $T_3$, the pressure in the furnace also increases from $P_2$ to $P_3$ according to Boyle-Charles' law. $T_3$ can be 1050 to 1300° C., and $P_3$ is 4 to 5 MPa.

Pulling of indium phosphide single crystals by the LEC method can be performed under the conditions normally applied. For example, the pull-up conditions can be adjusted according to the following: pull-up speed 5 to 20 mm/hour, pull-up axis rotation speed 5 to 30 rpm, crucible support axis rotation speed 10 to 20 rpm, and temperature gradient in B2O3 in the pull-up axis direction 130 to 85° C./cm.

The next step is to detach the grown crystal from the melt just before the crystal shoulder contacts the thermal baffle 111 by reducing the pulling speed to 300 mm per hour or less when the crystal solidification rate reaches 0.7 to 0.9. After detaching the grown crystals, the crucible 104 is lowered and cooled until the temperature in the furnace reaches room temperature, and then the crystals are removed. As a result, an indium phosphide single crystal ingot is obtained. In the present invention, room temperature refers to the temperature before heater heating in the LEC furnace and means about 10 to 30° C.

In the method for producing an indium phosphide single-crystal ingot in accordance with the embodiment of the present invention, as described above, impurities such as moisture contained in the hot zone of the furnace, the indium phosphide polycrystals of the raw material 102, and the $B_2O_3$ as the encapsulant 103, in the LEC furnace 100 under the environment immediately before crystal growth are sufficiently volatilized and removed. Therefore, indium phosphide substrates with suppressed occurrence of concave defects can be obtained using said indium phosphide single-crystal ingots.

[Method for Producing Indium Phosphide Substrate]

The indium phosphide substrate according to an embodiment of the present invention is provided by cutting the indium phosphide single-crystal substrates from the indium phosphide single-crystal ingot obtained in this way. More specifically, indium phosphide substrates can be produced from indium phosphide single-crystal ingots through the processes exemplified below.

First, indium phosphide single-crystal ingots are ground to cylinders. Next, a substrate is cut from the ground indium phosphide single-crystal ingot using a wire saw, etc.

Next, the surface is etched by immersing the substrate after cutting in a mixture of phosphoric acid solution and hydrogen peroxide solution, etc., to remove the process alteration layer created during the wire saw cutting process.

Next, the outer periphery of the substrate is chamfered to a diameter of 100 mm or less. In addition, at least one surface of the substrate after chamfering, preferably both surfaces, is polished (lapping).

Next, the surface is etched by immersing the substrate after polishing in a mixed solution of a phosphoric acid solution, hydrogen peroxide and ultrapure water, etc.

Next, the main surface of the substrate is polished to a mirror finish by polishing with an abrasive for mirror polishing.

Next, by washing, indium phosphide single-crystal substrates with diameters of 100 mm or less are produced.

[Semiconductor Epitaxial Wafer]

By epitaxially growing a semiconductor thin film onto the main surface of the indium phosphide substrate according to the embodiment of the present invention by a known method, an epitaxial crystal layer can be formed to produce a semiconductor epitaxial wafer. As an example of the epitaxial growth, an InAlAs buffer layer, an InGaAs channel layer, an InAlAs spacer layer and an InP electron supply layer may be epitaxially grown onto the main surface of the indium phosphide substrate to form a HEMT (High Electron Mobility Transistor) structure. When producing a semiconductor epitaxial wafer having such a HEMT structure, in general, a mirror-finished indium phosphide substrate is etched with an etching solution such as sulfuric acid/hydrogen peroxide solution to remove impurities such as silicon (Si) adhering to the substrate surface. The back surface of the etched indium phosphide substrate is brought into contact with the susceptor and supported, and in this state, an epitaxial film is formed on the main surface of the indium phosphide substrate by molecular beam epitaxy (MBE) or metal organic chemical vapor deposition (MOCVD).

EXAMPLES

Hereinafter, Examples are provided for better understanding of the present invention and its advantages. However, the present invention is not limited to these Examples.

Example 1

A LEC furnace of the form described in FIG. 1 was prepared. Next, the crucible was filled with indium phosphide polycrystalline material and $B_2O_3$ as a liquid encapsulant and placed in a high-pressure vessel. The crucible was then positioned at the lowest point in the furnace. The temperature in the furnace was defined as the temperature observed by thermocouples installed in the graphite crucible susceptor at the bottom of the crucible.

Next, the temperature in the LEC furnace was increased. The temperature increase conditions were based on the graph shown in FIG. 2 above, and the specific values are shown in Table 1 below. First, the furnace was heated from room temperature ($T_1$: 20° C.) to temperature $T_2$ by a heater while maintaining a vacuum at pressure $P_1$. The temperature increase rate from $T_1$ to $T_2$ was 17° C./min. The pressure in the LEC furnace was then increased to $P_2$ while maintaining the temperature $T_2$. Next, after raising the furnace temperature to $T_3$, the temperature at which indium phosphide melts, the seed crystal was brought into contact with the surface of the raw material melt, and the pull-up axis was gradually pulled up to grow a single indium phosphide crystal. Here, the pull-up speed was 10 mm/hr, the pull-up axis rotation speed was 20 rpm, the crucible support axis rotation speed was 15 rpm, and the temperature gradient in $B_2O_3$ in the pull-up axis direction was 110° C./cm.

Next, the growing crystals were detached just before the crystal shoulders contacted the thermal baffles by reducing the pull-up speed to 300 mm per hour or less when the solidification rate of the crystals reached 0.7 to 0.9. After detaching the grown crystals, the crucible was lowered and the crystals were removed after cooling until the temperature in the furnace reached room temperature. Indium phosphide single crystal ingots were thus produced.

The resulting indium phosphide single-crystal ingot was ground into a cylinder, and then the substrate was cut out using a wire saw, etc. to obtain an indium phosphide substrate with a diameter of 50.0 mm.

Example 2

Indium phosphide substrates were prepared as in Example 1, except that the temperature increase rate from $T_1$ to $T_2$ was set to 18° C./min and the temperature increase conditions were controlled as shown in Table 1.

Comparative Example 1 to 3

Indium phosphide substrates were prepared in the same manner as in Example 1, except that the temperature rise conditions were controlled as shown in Table 1. That is, in Comparative Examples 1 to 3, the temperature raising conditions were based on the graph shown in FIG. 3 above, and the furnace was not heated in a vacuum just before crystal growth. In the usual way, the furnace was pressurized from room temperature and pressure to a furnace pressure of 2.2 MPa ($P_2$) before heating to melt the raw material, bringing a seed crystal into contact with the surface of the raw material melt and a seed crystal was pulled up by gradually pulling up the pull-up axis to grow indium phosphide single crystals.

[Defect Evaluation]

The entire surface (main surface) of the prepared indium phosphide substrate was irradiated with a 405-nm wavelength laser beam in S-polarized light using KLA Tencor's Candela 8720 to detect concave and depressed defects of approximately 20 μm or more in diameter in the topography channel.

Both concave and convex shape defects can be counted as defects in the measurement of KLA Tencor's Candela 8720, but the analysis of concave defects was performed because there were no convex shape defects of 20 μm or more in diameter and none observed in the present invention, and because there were differences between the Examples and Comparative Examples in moisture control and the presence of concave shape defects of 20 μm or more in diameter. In other words, pits on the substrate surface (defects caused by impurities such as moisture contained in the raw material just before crystal growth in the producing process) can be detected as concave defects by the Candela 8720 measurement. The detection of concave shape defects can be identified by the phenomenon that the S-polarized laser light irradiated on the substrate descends the slope of the concave shape when it scans the substrate surface and ascends after passing through the bottom of the concave shape, causing the reflection direction of the light to shift downward and then upward relative to the normal reflection. In the case of a convex shape, the phenomenon is opposite to that of a concave shape and the direction of light reflection, and thus concave and convex shapes can be distinguished.

For indium phosphide substrates of Examples 1 to 2 and Comparative Examples 1 to 3, one or more substrates were prepared and the above defect counts were measured, respectively, and the average value was calculated.

The production conditions and evaluation results are shown in Table 1. In the temperature rise conditions in Table 1, $P_1$ to $P_3$ and $T_1$ to $T_3$ correspond to $P_1$ to $P_3$ and $T_1$ to $T_3$ shown in the graphs in FIG. 2 and FIG. 3, respectively.

TABLE 1

Figure 2:
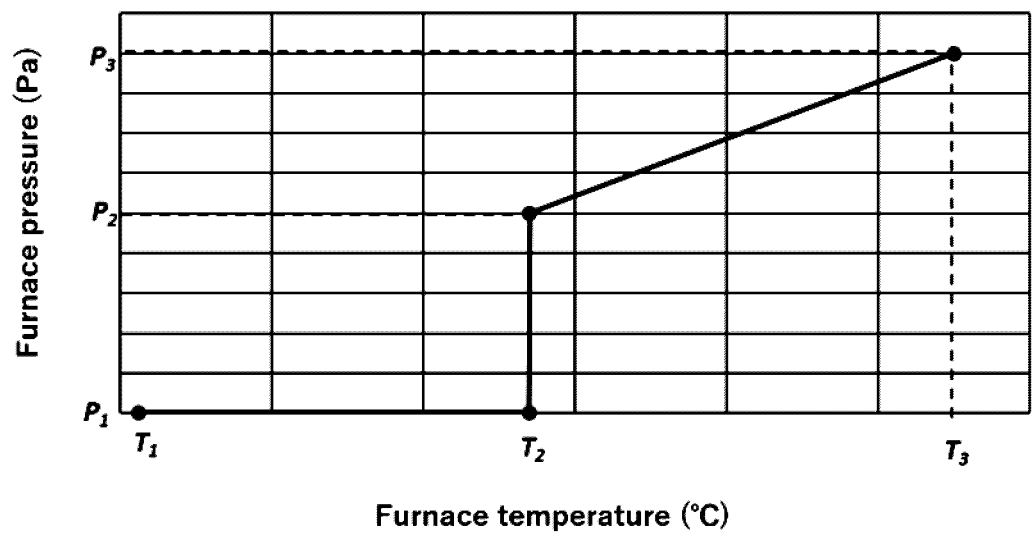
FIG. 2 is a graph showing the relationship between furnace temperature and furnace pressure during a temperature rising process in the LEC furnace according to an embodiment of the present invention.

|  | Example 1 | Example 2 | Comparative Example 1 | Comparative Example 2 | Comparative Example 3 |
|---|---|---|---|---|---|
| temperature rise condition | FIG. 2 | FIG. 2 | FIG. 3 | FIG. 3 | FIG. 3 |
| $P_1$(Pa) | 8.2 | 9.0 | Normal pressure | Normal pressure | Normal pressure |
| $T_1$(° C.) | 20 | 20 | 20 | 20 | 20 |

TABLE 1-continued

|  | Example 1 | Example 2 | Comparative Example 1 | Comparative Example 2 | Comparative Example 3 |
| --- | --- | --- | --- | --- | --- |
| $P_2$(Pa) | 3.50E+06 | 3.51E+06 | 2.20E+06 | 2.22E+06 | 2.20E+06 |
| $T_2$(° C.) | 557.5 | 552.2 | 20 | 20 | 20 |
| $P_3$(Pa) | 4.70E+06 | 4.68E+06 | 4.70E+06 | 4.69E+06 | 4.60E+06 |
| $T_3$(° C.) | 1070.8 | 1060.4 | 1137.4 | 1137.8 | 1090.6 |
| Number of substrates measured | 3 | 4 | 13 | 1 | 8 |
| Number of concave shape defects (average value) | 0 | 0 | 8.6 | 1 | 4.8 |

[Discussion]

In Examples 1 and 2, the temperature in the LEC furnace was increased to between 500° C. and 600° C. while maintaining a vacuum of 15 Pa or less (with vacuuming), and then the vacuuming was stopped and the pressure in the LEC furnace was increased to any pressure in the range of $2.0 \times 10^6$ Pa to $4.0 \times 10^6$ Pa with pure nitrogen gas (purity 6N, $H_2O$ dew point −80° C.: about 0.53 ppm or less). Then, indium phosphide single crystals were grown by pulling up seed crystals. Therefore, all of the concave defects on the surface of the indium phosphide substrate were zero.

On the other hand, in Comparative Examples 1 to 3, concave defects on the surface of the indium phosphide substrate were detected because the indium phosphide single crystals were grown based on conventional temperature increase conditions, respectively.

DESCRIPTION OF REFERENCE NUMERALS

100 LEC furnace
101 high-pressure vessel
102 raw material
103 encapsulant
104 crucible
105 crucible support shaft
106 seed crystal
107 indium phosphide single crystal
108 pull-up axis
109 heater
110 thermal insulation
111 thermal baffle

The invention claimed is:

1. An indium phosphide substrate,
    wherein the indium phosphide substrate has a diameter of 100 mm or less, and
    at least one of surfaces has zero concave defects detected in the topography channel, by irradiating a laser beam of 405 nm wavelength with S-polarized light on the surface.

2. The indium phosphide substrate according to claim 1, wherein the indium phosphide substrate has a diameter of 50 to 100 mm.

3. A semiconductor epitaxial wafer, comprising the indium phosphide substrate according to claim 1, and an epitaxial crystal layer on a main surface of the indium phosphide substrate.

4. A semiconductor epitaxial wafer, comprising the indium phosphide substrate according to claim 2, and an epitaxial crystal layer on a main surface of the indium phosphide substrate.

5. A method for producing an indium phosphide single-crystal ingot,
    wherein a crucible is installed in an LEC furnace, raw materials and an encapsulant are installed in the crucible, the raw materials and the encapsulant are heated and melted by a heater, and a seed crystal is brought into contact with a surface of a generated raw material melt and gradually pulled up to grow an indium phosphide single crystal, and
    wherein the indium phosphide single crystal is grown by pulling up the seed crystal after increasing a temperature in the LEC furnace from room temperature to between 500° C. and 600° C. while maintaining a vacuum of 15 Pa or less, followed by increasing a pressure in the LEC furnace to any pressure in the range between $2.0 \times 10^6$ Pa and $4.0 \times 10^6$ Pa.

6. A method for producing an indium phosphide substrate, comprising
    a process of cutting an indium phosphide substrate from the indium phosphide single-crystal ingot produced by the method for producing an indium phosphide single-crystal ingot according to claim 5.

7. The method for producing an indium phosphide substrate according to claim 6, wherein the indium phosphide substrate has a diameter of 100 mm or less.

* * * * *